United States Patent [19]

Husain

[11] Patent Number: 4,505,225

[45] Date of Patent: Mar. 19, 1985

[54] SELF-ALIGNING APPARATUS FOR SEMICONDUCTOR LEAD FRAME PROCESSING MEANS

[75] Inventor: Syed Husain, San Jose, Calif.

[73] Assignee: National Semiconductor Corporation, Santa Clara, Calif.

[21] Appl. No.: 528,016

[22] Filed: Aug. 31, 1983

[51] Int. Cl.³ ............................................. B05C 13/02
[52] U.S. Cl. ..................................... 118/669; 118/680
[58] Field of Search ............... 118/669, 672, 680, 682, 118/686, 687, 706, 673, 715

[56] References Cited

U.S. PATENT DOCUMENTS

| | | | |
|---|---|---|---|
| 2,977,924 | 4/1961 | Bender et al. | 118/669 |
| 3,104,986 | 9/1963 | Goman et al. | 118/682 |
| 3,562,036 | 2/1971 | Travis | 118/669 X |
| 3,999,506 | 12/1976 | Butler et al. | 118/673 |
| 4,063,993 | 12/1977 | Burns | 427/96 X |
| 4,364,977 | 12/1982 | Bernardi | 118/669 X |

Primary Examiner—John D. Smith
Assistant Examiner—Bernard F. Plantz
Attorney, Agent, or Firm—Michael J. Pollock; Paul J. Winters; Gail W. Woodward

[57] ABSTRACT

Apparatus is disclosed for accurately aligning a processing device with respect to a predetermined reference location on semiconductor lead frame. The apparatus is especially suitable for use with a plating head for plating the pads of a lead frame. The apparatus includes a drive motor having a precision lead screw for attachment to the processing device to shift the device through a small distance to accurately position the device with respect to the predetermined reference positions on the lead frame. The drive motor is coupled to a rotary encoder which is rotated in response to the movement of a pin positioned to enter a reference hole in the lead frame. As the lead frame is advanced by an indexing device, the pin enters a reference hole in the lead frame near the end of the travel of the lead frame, causing the rod to rotate the encoder and supply a signal which for comparison with a reference signal. The output of the comparator is applied to the motor for advancing the processing device incrementally to position it accurately with respect to the reference locations on the lead frame.

8 Claims, 4 Drawing Figures

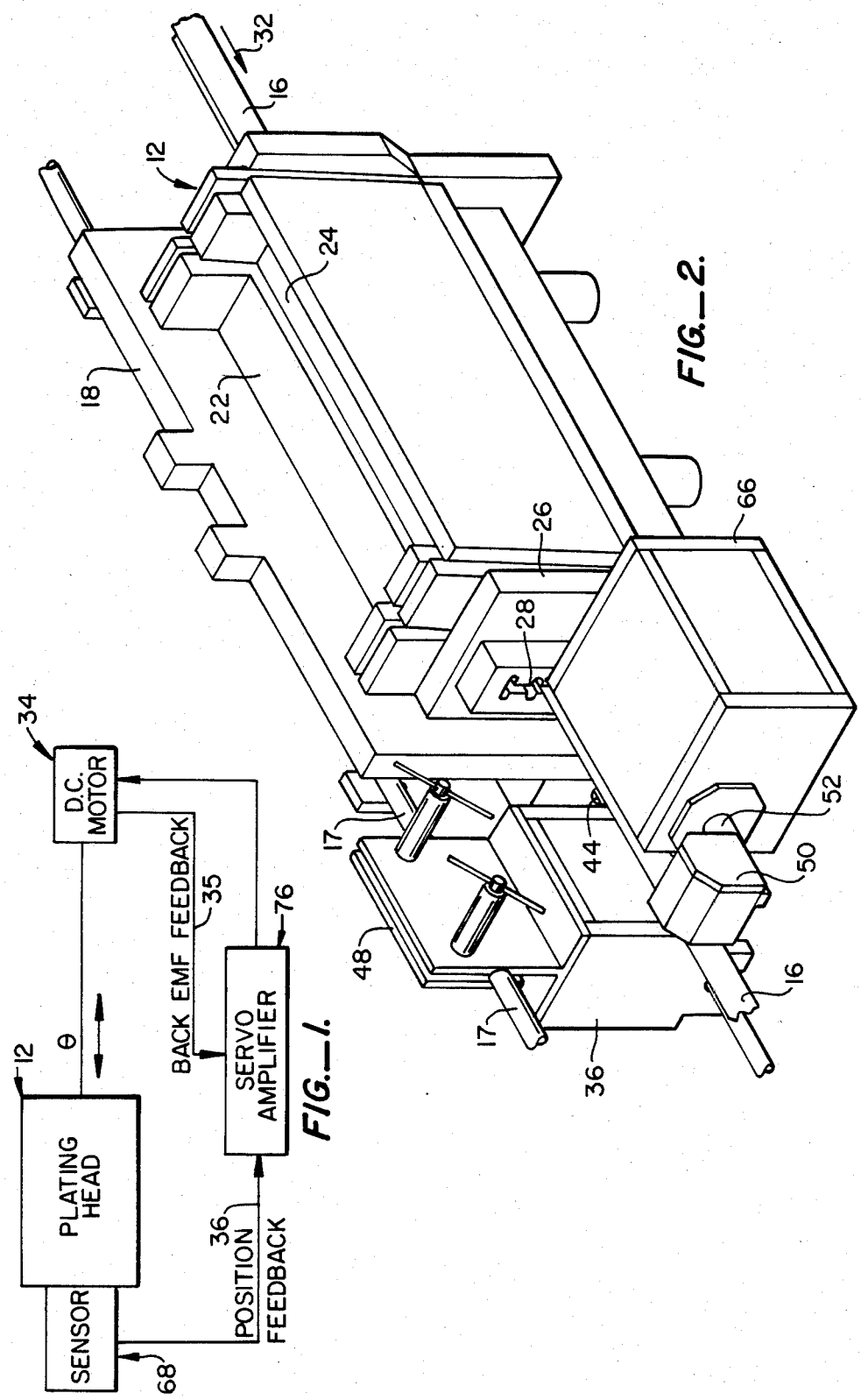

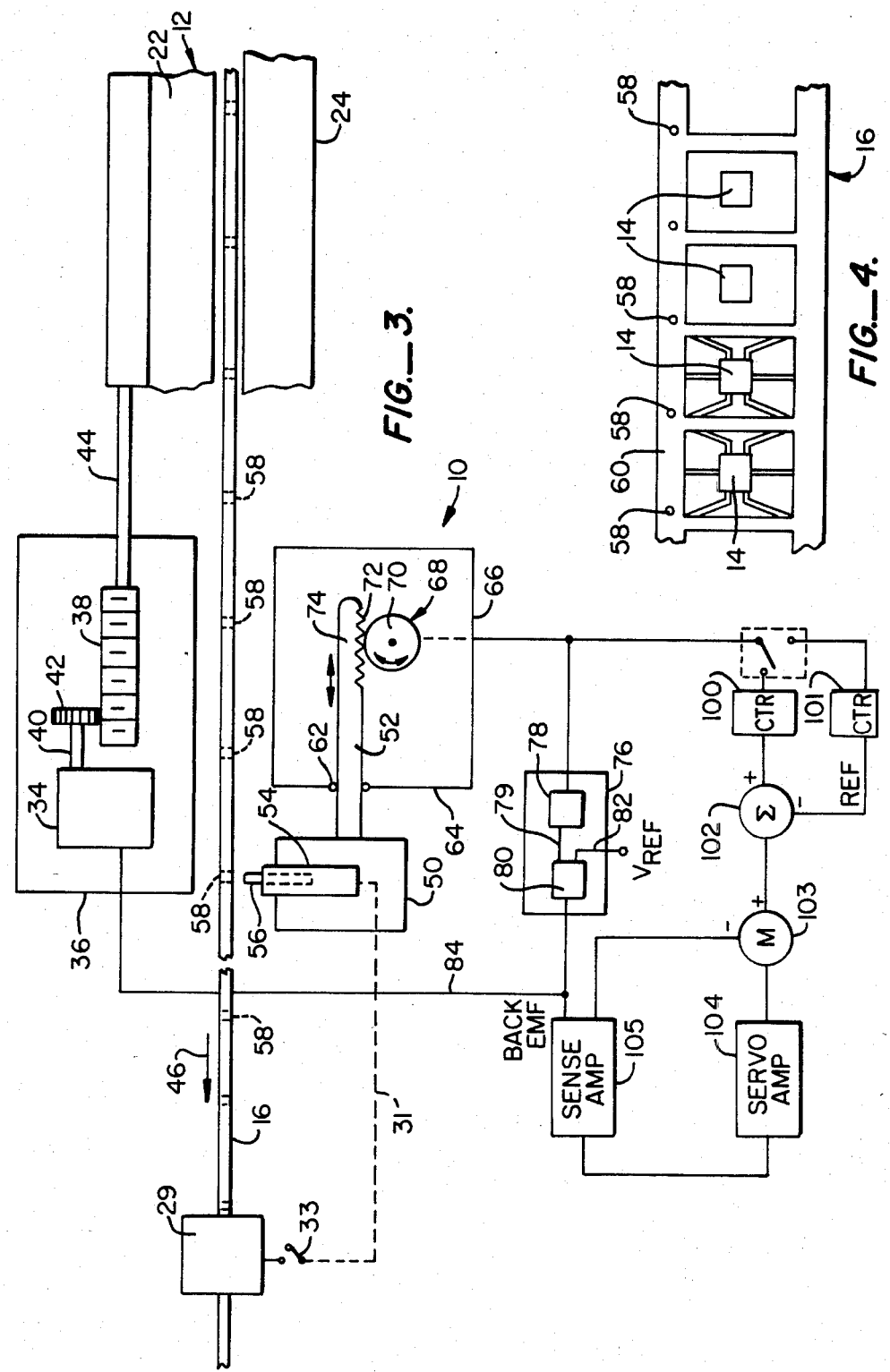

SELF-ALIGNING APPARATUS FOR SEMICONDUCTOR LEAD FRAME PROCESSING MEANS

BACKGROUND OF THE INVENTION

1. Field of the Invention

This invention relates to the processing of semiconductor lead frames and, more particularly, to apparatus for automatically aligning a lead frame and a processing device, such as a plating head for plating the pads of the lead frame.

2. Description of the Prior Art

In the plating of the pads of a semiconductor lead frame, a relatively long length of the lead frame is advanced by an indexing device incrementally past a plating head. At each stop, a number of pads are simultaneously plated. Then the lead frame is advanced by the indexing device through a selected distance, such as 9 to 11 inches, bringing new pads to be plated into the plating head. Because the indexing device is a relatively long distance away from the plating head, errors are generated in the positioning of the pads relative to the head, and these errors must be compensated for to assure that the pads are properly plated.

In the prior art, to compensate for these positioning errors the plating head has been moved minutely after the lead frame is stopped. The movement of the plating head is done manually, for example, by manual rotation of an advancing screw, by the turning of a handle, or by other similar means. These adjustments require operator attention at all times during the operation of the plating head, resulting in additional labor costs and difficulty of accurate repetition. Furthermore, human error makes accurate alignment of the pads relative to the plating head difficult.

In view of the problems mentioned above, a need exists for apparatus for automatically aligning the plating head and pads of a semiconductor lead frame after the lead frame has been moved by the indexing device, for example, following the plating of a group of pads in the plating head. The present invention satisfies the aforesaid need and provides apparatus which is simple and rugged in construction, highly reliable, and requires substantially no operator attention.

SUMMARY OF THE INVENTION

The apparatus of the present invention includes a drive motor which is fed from the signal output of a comparator having two inputs, one input receiving a signal which provides a reference position and the other input receiving a signal from the output of a rotary optical encoder. The optical encoder is actuated by a rack and pinion device which is coupled through a pin to an actuator, pin being receivable in a reference hole in one margin of a semiconductor lead frame which has passed through the plating head. The actuator device is energized near the end of the normal excursion or indexing movement of the lead frame so that the pin and the rack of the rack device are moved with the lead frame through an incremental distance, such as 0.100 to 0.200 inches.

The movement of rack and pinion generates a signal by the operation of the rotary encoder, and the signal is applied to the comparator and compared with the reference voltage. The output of the comparator is applied to the drive motor through a servo amplifier which operates a lead screw or other similar device coupled to the plating head itself. Thus, when the drive motor is energized, the plating head is moved through the incremental distance so that it comes into proper alignment with the pads on the lead frame. The reference position is selected initially by manual operation of the system, and once established remains the same because the reference holes which successively receive the pin of the actuator device are uniformly spaced apart along the lead frame.

A primary object of the present invention is to provide apparatus for aligning a semiconductor processing device with specific reference locations on a semiconductor lead frame wherein the alignment is done automatically and without operator attention to thereby minimize cost without sacrificing alignment reliability.

Another object of the present invention is to provide apparatus for aligning the pads of a semiconductor lead frame with a plating head. The apparatus includes pin structure which moves a short distance during indexing of the semiconductor lead frame to cause actuation of a rotary encoder. The encoder provides a signal which is compared with a reference signal to provide an input signal to a drive motor. In this manner the plating head can be moved an incremental distance sufficient to bring it into proper alignment with the pads on the semiconductor lead frame, all of which is done automatically and without operator attention.

Other objects of this invention will become apparent from the following more detailed explanation, reference being had to the accompanying drawings for an illustration of the invention.

BRIEF DESCRIPTION OF THE DRAWINGS

FIG. 1 is a simplified schematic of the self-aligning apparatus for a processing device, such as the head for plating the pads of the semiconductor lead frame;

FIG. 2 is a perspective view of the plating head and several of the components of the self-aligning apparatus of the present invention, showing a semiconductor lead frame movable past the plating head and coupled with the apparatus;

FIG. 3 is a top view of the apparatus, illustrating the manner in which the apparatus is coupled to the head and the lead frame; and FIG. 4 is a view of a typical semiconductor lead frame suitable for use with the apparatus of the present invention.

DETAILED DESCRIPTION OF THE PREFERRED EMBODIMENT

The apparatus of the present invention is generally denoted by the numeral 10 (FIG. 3) and is adapted to be used with a conventional plating head 12 for plating the pads 14 of a semiconductor lead frame 16 (FIG. 4). As is well known the lead frame supports the die and provides suitable electrical connections between the die and a socket, printed circuit board, or other apparatus. After the die is bonded to the lead frame and electrical connections made, the completed assembly is often encapsulated in a suitable plastic material. Lead frames for supporting semiconductor die are well known in the prior art and are sold commercially in many different sizes and shapes. The lead frame 16 shown in FIG. 4 is only representative of the type of lead frames which may be used with plating head 12.

As shown in FIG. 2, plating head 12 includes a support 18 shiftably coupled with a fixed, horizontal support bar 17. For purposes of illustration, support 18 is a vertical plate 20. Plating head 12 includes a pair of head sections 22 and 24 which are coupled by an end plate 26. Sections 22 and 24 are movable toward and away from each other to enable them to close on a semiconductor lead frame 16 and plate one or more of the pads 14 of the lead frame simultaneously. Generally, 4 to 8 pads 14 are plated at the same time, although the capacity of the plating head will depend upon its size, as well as the size of the lead frames.

End plate 26 has a slot 28 through which lead frame 16 may pass. Similarly, the end plate at the opposite end of plating head 12 has a similar slot (not shown) for receiving the lead frame, the direction of travel of the lead frame being denoted by the arrow 32.

Plating heads such as head 12 described above, are well known and conventional in construction. Plating head 12 provides an example of a device which can be precisely aligned with reference locations on a semiconductor lead frame by using apparatus 10 of the present invention. Apparatus 10 provides precision alignment of pads 14 of semiconductor lead frame 16 with respect to the plating portions of head sections 22 and 24 of plating head 12. Unless the pads are properly aligned, they cannot be properly plated by head 12, resulting in defective parts, lower yields, and consequently higher costs.

Indexing means 29 is coupled to lead frame 16 (shown on edge) for advancing the lead frame incrementally relative to the plating head 12. Typically, indexer 29 comprises a pneumatic indexer which can be automatically operated. In most applications the indexer will be a relatively long distance, such as 25 to 50 feet, from the plating head. Commercially available indexers advance the lead frame incrementally through a distance on the order of 10 to 12 inches each time the indexer is energized.

As shown in FIG. 3 apparatus 10 includes a DC servo motor 34 in a housing 36 containing a rotatable lead screw 38. The drive shaft 40 of motor 34 has a spur gear 42 coupled with lead screw 38. When motor 34 is energized, lead screw 38 is rotated to shift a link 44 coupled to plating head 12 to advance the plating head in the direction of arrow 46. This operation is described further below. Housing 36 is secured by a clamp 48 (FIG. 2) to rigid support bar 17 along which support 20 and head 12 move. Thus, motor 34 and lead screw 38 are stationary with respect to support rod 17.

A housing 50 is carried by a rod 52 (FIGS. 2 and 3) on the opposite side of the path of travel of lead frame 16 from housing 36. Housing 50 contains a pneumatic actuator 54. Actuator 54 has a retractable pin 56 which projects from housing 50 and is capable of entering a reference hole 58 along a lower margin 60 of lead frame 16.

Rod 52 is shiftably mounted by a bearing 62 on one side 64 of a housing 66. A rotary optical encoder 68 in housing 66 has a spur gear 70 in mesh with teeth 72 on the inner end 74 of rod 52. Thus, the inner end 74 of rod 52 and spur gear 70 define a rack and pinion device in which the spur gear rotates counterclockwise when rod 52 moves to the left. Rod 52 moves to the left when pin 56 is received in a hole 58 of lead frame 60 and pulled laterally with the lead frame through an incremental distance during the last part of the indexing movement.

Rotary encoder 68 is coupled to circuitry 76 which counts pulses and compares this count to a reference count. The difference between these counts is applied to a digital to analog converter. The resulting output voltage is applied to a servo-amplifier (as the position feedback) which moves the motor 34, which causes rotation of lead screw 38 to move link 44 and plating head 12 incrementally in the direction of arrow 46 (FIG. 3).

In operation, lead frame 16 will be threaded between head sections 22 and 24 as shown in FIGS. 2 and 3 and coupled with indexer 29 as shown in FIG. 3. Assuming that indexer 29 has advanced the lead frame into position for the first plating operation, the head is manually adjusted for accurate alignment of pads 14 of the lead frame 16 with head sections 22 and 24 by operating a manual switch coupled to motor 34. Actuator 54 and pin 56 are coupled as indicated by line 31 (FIG. 3) to indexer 29. In this manner switch 33 in line 31 may energize actuator 54 to cause pin 56 to project into a timing hole 58 in the lead frame. Thus, when actuated manually, the motor 34 drives the head incrementally, typically through a distance of 0.100 to 0.200 inches, so connector 44 moves the plating heads into accurate alignment with pads 14 for plating. This small movement of the head frame will cause lateral movement of housing 50 and thereby pin 56, causing the rack portion 74 of rod 52 to rotate gear 70 through a certain angular distance on the order of 20 to 30 degrees. Typically, the output of encoder 68 is 10,000 pulses per revolution of spur gear 70. Thus for a revolution of 30 degrees, the encoder will supply approximately 1,000 pulses which are counted by a reference position counter 101. With the reference position established, the machine is operated automatically thereby plating the lead frame pads 14 without operator attention.

In the first cycle of operation, indexer 29 advances the lead frame 16 through a predetermined distance, typically 10 to 12 inches, to bring new pads 14 into plating head 12 to be plated. Near the end of the 10 to 12 inch movement of the lead frame, switch 33 will be closed to actuate device 54, causing pin 56 to project outwardly and to be in a position to enter the next hole 58 in margin 60 of lead frame 16. When the pin does enter this hole, device 54 becomes coupled to the lead frame and is advanced to the left a small distance, causing rod 52 to move to the left and causing rotation of gear 70. The rotation generates a series of output pulses which are applied to counter 100. The output of counter 100 is compared to reference counter 101, causing a voltage proportional to the distance from the desired position to be supplied. This voltage is then summed at node 103 with a voltage proportional to the back EMF of the motor (velocity feedback) and applied to the servo amplifier 104 to drive motor 34 to rotate lead screw 38. Rotation of lead screw 38 will cause link 44 to move in the direction of arrow 46, thereby moving plating head 12 into accurate alignment with pads 14 of lead frame 16. The plating head is then operated to plate a number of pads 14 in the head. The plating can be done on only one side of each pad or on opposite sides thereof, depending upon the construction of the head itself. When the plating is completed, the head sections open and indexer 29 is again actuated to advance lead frame 16 to the left, and the process repeated.

· When the plate sections open after a plating operation, motor 34 drives plating head 12 back to its initial starting position. This enables the system always to move in one direction and thus minimize the effect of backlash and system compliance. Once the system is operational head 12 can be literally "tuned" to attain the best position by adjusting the value of the reference count applied to the summing junction 102.

Back EMF feedback from the motor 105 adjusts the velocity and eliminates the need for a tachometer. Thus, continuous velocity and position feedback is available for maximum speed and position accuracy. The position feedback is summed at junction 102 and the velocity is summed at junction 103.

I claim:

1. Apparatus for aligning a processing device with a semiconductor lead frame travelling along a path, said apparatus comprising: an actuator device having a retractable projection capable of entering a reference hole in the semiconductor lead frame; means for moveably mounting the actuator device along the path, said actuator device adapted to be coupled with a source of power for urging the projection into a reference hole of an adjacent lead frame, whereby the actuator device will move with the lead frame when the projection is in the reference hole of the lead frame; means coupled with said actuator for generating an output signal as a function of the distance through which the actuator moves with the lead frame; a drive means capable of being coupled to the processing device for moving relative to the lead frame in response to the output signal.

2. Apparatus as set forth in claim 1, wherein said mounting means comprises a rack and pinion device.

3. Apparatus as set forth in claim 1, wherein said actuator device comprises a pneumatic actuator, having a shiftable pin carried thereby, said pin defining said projection.

4. Apparatus as set forth in claim 3, wherein said mounting means comprises a rack and pinion device, one end of the rack being coupled to the pneumatic actuator, said means for generating said output signal comprising a rotary encoder responsive to the linear movement of the rack.

5. Apparatus as set forth in claim 3 and further including a comparator for receiving a signal from the rotary encoder and a second reference signal, the output of the comparator being coupled to the drive means.

6. Apparatus as set forth in claim 1, wherein said drive means includes a drive motor having an output shaft coupled with a lead screw, the lead screw adapted to be coupled to the processing device for shifting the same as a function of the operation of the drive motor.

7. Apparatus as set forth in claim 1, wherein said actuator device comprises a pneumatic actuator having a pin receivable in a hole in the lead frame, said pin defining said projection, said mounting means comprising a shiftable rod having teeth at one end thereof and a spur gear in mesh with the teeth, said signal generating means comprising a rotary encoder coupled to the spur gear and responsive to the rotation thereof for providing said output signal, said providing means including a comparator having a first input coupled to the encoder and a second input for receiving a reference signal, said drive means including a drive motor coupled to the output of the comparator, and a lead screw coupled to the drive motor and rotated thereby, the lead screw adapted to be coupled to the processing device.

8. Apparatus as set forth in claim 1 and further including an indexing device for moving the lead frame relative to the processing device, said indexing device providing an end of travel signal for energizing said actuator device.

* * * * *